United States Patent [19]
Houston

[11] Patent Number: 6,045,625
[45] Date of Patent: Apr. 4, 2000

[54] BURIED OXIDE WITH A THERMAL EXPANSION MATCHING LAYER FOR SOI

[75] Inventor: Theodore W. Houston, Richardson, Tex.

[73] Assignee: Texas Instruments Incorporated, Dallas, Tex.

[21] Appl. No.: 08/985,697

[22] Filed: Dec. 5, 1997

Related U.S. Application Data

[60] Provisional application No. 60/031,487, Dec. 6, 1996.

[51] Int. Cl.[7] .................................................. H01L 29/12
[52] U.S. Cl. ...................... 148/33.3; 438/455; 438/459; 257/508
[58] Field of Search .................................. 438/406, 455, 438/459, FOR 222; 148/DIG. 12, DIG. 50, DIG. 85, DIG. 86, 33.3; 257/505, 499, 506

[56] References Cited

U.S. PATENT DOCUMENTS

| | | |
|---|---|---|
| 4,666,556 | 5/1987 | Fulton et al. . |
| 5,049,521 | 9/1991 | Belanger et al. . |
| 5,054,683 | 10/1991 | Haisma et al. . |
| 5,168,078 | 12/1992 | Reisman et al. . |
| 5,366,923 | 11/1994 | Beyer et al. . |
| 5,387,555 | 2/1995 | Linn et al. . |
| 5,413,952 | 5/1995 | Pages et al. . |
| 5,728,623 | 3/1998 | Mori . |
| 5,755,914 | 5/1998 | Yonehara . |
| 5,855,693 | 1/1999 | Murari et al. . |

OTHER PUBLICATIONS

1995 IEEE, IEDM 95–877, "Back Gated CMOS on SOIAS for Dynamic Threshold Voltage Control", pp. 35.1.1–35.1.4 (Isabel Y. Yang, Carlin Vieri, Anantha Chandrakasan, Dimitri A. Antoniadis).

Jun. 1996 IEEE Electron Device Letters, vol. 17, No. 6, "Elimination of the Sidewall Defects in Selective Epitaxial Growth (SEG) of Silicon for a Dielectric Isolation Technology", pp. 267–269 (John M. Sherman, Gerold W. Neudeck, Fellow, IEEE, John P. Denton, Member, IEEE, Rashid Bashir, Member IEEE, and William W. Fultz, Associate Member, IEEE).

Jun. 1996 IEEE Electron Device Letters, vol. 17, No. 6, "Oxynitride Gate Dielectric Grown in Nitric Oxide (NO): The Effect of Reoxidation on Dielectric Reliability of the Active Edge", pp. 279–281 (Bikas Maiti, Member, IEEE, Philip J. Tobin, Member, IEEE, Yoshio Okada, Member, IEEE, Kimberly G. Reid, Sergio A. Ajuria, Rama I. Hegde, and Vidya Kaushik).

*Primary Examiner*—George Fourson
*Attorney, Agent, or Firm*—Jacqueline J. Garner; Wade James Brady III; Richard L. Donaldson

[57] ABSTRACT

A silicon-on-insulator structure (10) having a thick buried multi-layer (14) is disclosed herein. The thick buried multi-layer (14) comprises a thermal expansion coefficient matching layer (14b) between two insulator layers (14a,14c). The thermal expansion co-efficient matching layer (14b) comprises a material that more closely matches the thermal expansion co-efficient of the silicon substrate (12). Examples include polysilicon and nitridized oxide.

15 Claims, 3 Drawing Sheets

BURIED OXIDE WITH A THERMAL EXPANSION MATCHING LAYER FOR SOI

This application claims priority under 35 USC § 119 (e)(1) of provisional application number 60/031,487, filed Dec. 6, 1996.

FIELD OF THE INVENTION

This invention generally relates to semiconductor processing of SOI devices and more specifically to buried oxide layers in SOI.

BACKGROUND OF THE INVENTION

A modern method of forming integrated circuit devices involves the formation of silicon devices in a thin film of single crystalline silicon material separated from a substrate of silicon material by a layer of buried oxide or insulator. This is commonly referred to as silicon on insulator construction or SOI construction. SOI construction allows for high performance silicon devices due to, among other reasons, the reduction in junction capacitance between diffused areas within the devices and the substrate.

For certain applications, such as r.f., applications, a very thick buried oxide (e.g., ~10 µm) is desirable. A thicker underlying dielectric not only reduces capacitance but also reduces high frequency power loss, allowing the fabrication of high Q inductors. For high frequency (Ghz range), thicknesses on the order of 10 µm are desired. However, in the past, the thickness of buried oxides has been limited to on the order of 2 µm or less. This is due to the fact that the difference in thermal expansion between the buried oxide and the silicon causes warping. As the thickness of the buried oxide increases, the amount of warping also increases. Accordingly, there is a need for a thicker buried oxide that does not cause unacceptable amounts of warping.

In addition to the problem of warping, thick buried oxide increases the problems of thermal isolation. The thermal conductivity of silicon dioxide is about one tenth that of silicon. The result is higher operating temperatures for ICs on SOI relative to ICs on Bulk silicon. Local heating can also be a problem. Thus, using a thicker buried oxide to achieve benefits of thicker dielectric has been a trade-off with increased thermal isolation. Accordingly, there is a need for increased effective dielectric thickness that does not cause unacceptable amounts of thermal isolation.

SUMMARY OF THE INVENTION

A silicon-on-insulator structure having a thick buried insulating layer is disclosed herein. The SOI structure comprises a substrate, a silicon device, and a buried insulating layer between the substrate and device layer. The net coefficient of thermal expansion of the buried insulating layer substantially matches the co-efficient of thermal expansion of silicon more nearly than does silicon dioxide.

An advantage of the invention is providing a thick buried layer for SOI without the warping associated with the prior art.

Another advantage of the invention is providing a thick buried layer having low capacitance, low stress and good thermal conduction.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
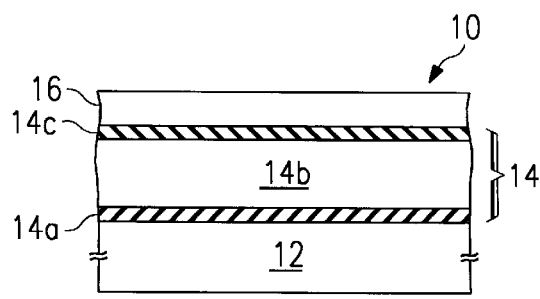
FIG. 1 is a cross-sectional diagram of a SOI structure according to the invention.

The invention will now be described in conjunction with the formation of a buried layer for a SOI substrate. However, the benefits of the invention are applicable in general to situations in which stress in between a silicon layer and an underlying insulating layer due to mismatched thermal co-efficient of expansion is present A SOI structure 10 according to the invention is shown in FIG. 1. Structure 10 consists of a substrate layer 12, a buried multi-layer 14 and a thin single crystalline silicon device layer 16. The thickness of buried multi-layer 14 is much thicker than ordinary SOI buried oxide layers. For example, it may be on the order of 10 µm thick. Buried multi-layer 14 consists of a conventional insulator layer 14a adjacent the substrate layer 12. For example, layer 14a may comprise silicon dioxide. Layer 14c is located adjacent the upper thin single crystalline device layer 16 and also comprises a conventional insulator material such as silicon dioxide.

The middle layer, layer 14b, comprises a material having a thermal co-efficient of expansion similar to that of the silicon substrate 12. For example, layer 14b may comprise polysilicon, nitridized oxide, or silicon nitride. The closer the match of thermal co-efficient of expansion the less warping or stress will occur. In order to be an improvement over the prior art, the thermal co-efficient of expansion of layer 14b should more closely match that of silicon than the thermal co-efficient of expansion of layers 14a and 14c does. In addition to having a thermal co-efficient of expansion similar to the silicon substrate 12, layer 14b should preferably have a higher thermal conduction than the conventional buried oxide and result in low capacitance like the conventional buried oxide.

The layer 14a serves as a buffer between the crystal silicon of the substrate 12 and layer 14b. Layer 14c serves a similar function between layer 14b and the device layer 16. For example, if layer 14b comprises polysilicon, layers 14a and 14c act as electrical isolation. If layer 14b is silicon nitride, layers 14a and 14c would typically be of more pliant material, such as silicon dioxide, and reduce the stress that the stiffer silicon nitride would induce in the crystal silicon substrate 12 or the device layer 16. Layers 14a and 14c may also act as a bond interface. Layers 14a and 14c need not be symmetrical. Typically 14c is an oxide that is grown on the wafer that forms the device layer 16. This may be augmented with a deposited dielectric. Optionally, the oxide may be grown in nitric oxide (NO) to form a nitrided oxide. Layers 14a and 14c are preferably in the range of a few nm to tens of nm thick. The thickness of layer 14b is preferably in the range of hundreds of nm to several $\mu$m. For the case where layer 14b comprises nitrided oxide, layers 14a and 14c could be a grown nitrided oxide with layer 14b being a deposited nitrided oxide. Optionally, in this case, layers 14a and 14c could be omitted. For the case where layer 14b comprises silicon nitride, the thicker layer 14b is the thicker layers 14a and 14c need to be to balance warping stress. It should be noted that layers 14a, 14b, and 14c may themselves each be multi-layers. For example, layer 14c may be a grown oxide and a deposited oxide. Layer 14b may be multiple layers of a nitride and oxide.

With multiple layers, with a change in temperature each layers tries to expand some amount laterally independent of how thick the layer is. Therefore, the stiffness of the material, as well as its thickness, enters into the resulting strain and warping. Since silicon nitride is stiffer than silicon dioxide, a relatively thin layer of silicon nitride could balance a thicker silicon dioxide layer. So, for example, if layers 14a and 14c are silicon dioxide and layers 14b is silicon nitride, an embodiment of the invention could have layers 14a and 14b being relatively thin (e.g. a few nm) and layers 14c could be thicker (e.g. a few $\mu$m). However, a thicker silicon nitride layer still has the advantage of better thermal conduction.

Figure 2A:
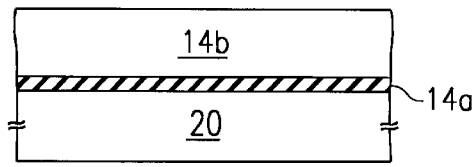
FIGS. 2A–2C are cross-sectional diagrams of the SOI structure of FIG. 1 at various stages of fabrication.
Figure 2B:
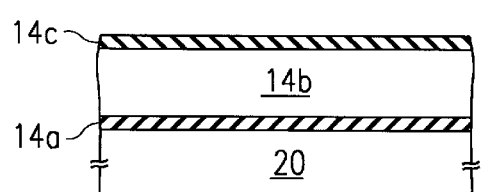
Figure 2C:
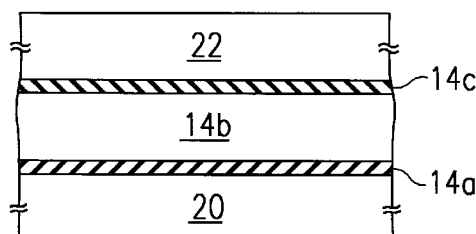

A first exemplary method of forming the SOI structure 10 will now be discussed with reference to FIGS. 2A–2C. On a starting silicon wafer 20, an oxide layer 14a is grown and/or deposited as shown in FIG. 2A. Typical thickness is on the order of 10 nm, but the exact thickness is not critical and different thicknesses can be used. Next, a material having a coefficient of thermal expansion closer to silicon than silicon dioxide is deposited on layer 14a to form layer 14b. For example, layer 14b may comprise silicon (either poly or amorphous) or a silicon oxynitride. If a silicon layer is used, by having silicon layer 14b near intrinsic, it acts as a dielectric but will have thermal characteristics of crystalline silicon. The thickness of the deposited layer 14b depends on the desired effective dielectric thickness, possibly with a trade-off of expense and stability. Typical thickness may be in the range of 1–10 $\mu$m.

Next, a second oxide layer 14c is grown and/or deposited. As shown in FIG. 2B, oxide layer 14c is formed on layer 14b. However, oxide layer 14c may alternatively or additionally be formed on a second silicon wafer 22 prior to the bonding step described below. A typical thickness is on the order of 10 nm, although it is not necessary that the first (14a) and second (14c) oxides have the same thickness. Referring to FIG. 2C, the second wafer 22 is bonded to the oxide layer 14c.

Either the first wafer 20 or the second wafer 22 is then thinned to form a device layer 16 of FIG. 1. The other of the two wafers becomes the substrate layer 12 of FIG. 1. Various techniques for thinning a wafer are known in the art, some of which require some initial processing of the starting wafer prior to bonding. For example, some use impurity doping to act as etchstops, or implantation of hydrogen to form a cleavage plane.

It should be noted that various dielectrics may be used in place of the oxide for layers 14a and 14c described above.

For example, a nitrided oxide may be used, for example by growing the oxide in an N2O ambient or an ammonia ambient. If a deposited oxide, such as TEOS, is used, it is preferred to include a densification of the deposited oxide prior to bonding.

Figure 3A:
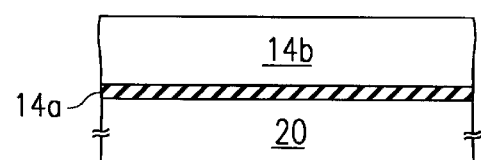
FIGS. 3A–3E are cross-sectional diagrams of the SOI structure of FIG. 1 including a silicide layer at various stages of fabrication.
Figure 3B:
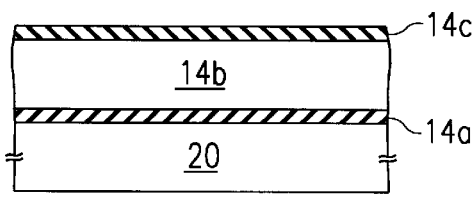

A second exemplary method of forming the SOI structure 10 including a patterned silicide will now be discussed with reference to FIGS. 3A–3E. As in the first method, an oxide layer 14a is grown and/or deposited on a starting silicon wafer 20. A silicon (poly or amorphous) layer 14b is then formed on oxide layer 14a, as shown in FIG. 3A. It is important to note that this embodiment applies to the case where silicon (either poly or amorphous) is used for layer 14b and not for the case where silicon oxynitride is used. Typical thickness are the same as in the first embodiment. Next, a second oxide layer 14c is grown and/or deposited. As shown in FIG. 3B, oxide layer 14c is formed on silicon layer 14b. A typical thickness is on the order of 10 nm, although it is not necessary that the first (14a) and second (14c) oxides have the same thickness.

Figure 3C:
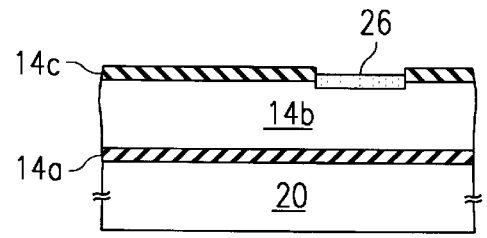
Figure 3D:
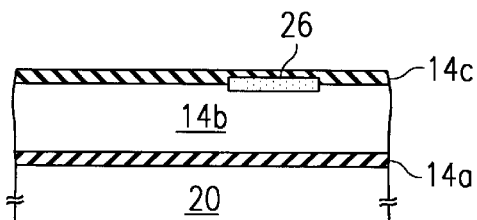

At this point, oxide layer 14c is patterned and etched to expose portions of silicon layer 14b where silicide is desired. Then, a silicide 26 is formed on the exposed silicon, as shown in FIG. 3C. Typically, a metal such a titanium is deposited followed by a sinter to react the metal with the silicon to form the silicide 26. The unreacted metal is then removed. If desired, a full unpatterned silicide layer could be formed and used as an isolated conducting plane by delaying the deposition of oxide layer 14c until after suicide formation. Referring to FIG. 3D, additional oxide is deposited to extend layer 14c over the silicide 26. It is most likely necessary to planarize layer 14c prior to bonding, for example using CMP (chemical-mechanical polishing) or using a self-planarizing material such as BPSG.

Figure 3E:
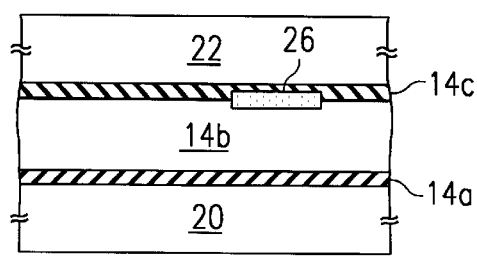

Referring to FIG. 3E, the second wafer 22 is bonded to the oxide layer 14c. Then, either the first wafer 20 or the second wafer 22 is thinned to form a device layer 16 of FIG. 1. The other of the two wafers becomes the substrate layer 12 of FIG. 1. As described above, various techniques for thinning a wafer are known in the art As in the first embodiment, various dielectrics may be used in place of the oxide for layers 14a and 14c described above. For example, a nitrided oxide may be used. If a deposited oxide, such as TEOS, is used, it is preferred to include a densification of the deposited oxide prior to bonding.

Figure 4A:
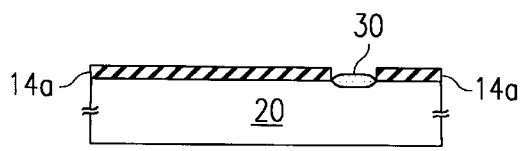
FIGS. 4A–4F are cross-sectional diagrams of the SOI structure of FIG. 1 including a contact to the buried silicon layer at various stages of fabrication.

A third exemplary method of forming the SOI structure 10 including a contact to the silicon portion of the buried multilayer 14 will now be discussed with reference to FIGS. 4A–4F. On a staring silicon wafer 20, an oxide layer 14a is grown and/or deposited as shown in FIG. 4A. Typical thickness is on the order of 10 nm, but different thicknesses can be used. Next, the oxide layer 14a is patterned and etched to expose a portion of the starting wafer 20. If desired, a silicide layer 30 may be formed on the exposed portion of starting wafer 20 to improve the contact between starting wafer 20 and the subsequently formed layer 14b. Method for forming silicide are known in the art.

Figure 4B:
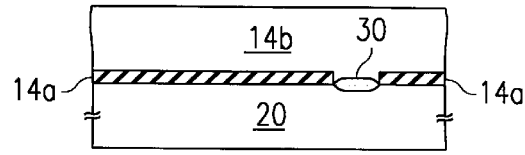

Next, a silicon (either poly or amorphous) layer 14b is deposited over layer 14a and the exposed portion of starting wafer 20 or silicide layer 30, as shown in FIG. 4B. Layer 14b is thus in contact with starting wafer 20. Typical thickness for layer 14b may be in the range of 1–10 $\mu$m. If desired, layer 14b may be doped to be conductive in this case.

Figure 4C:
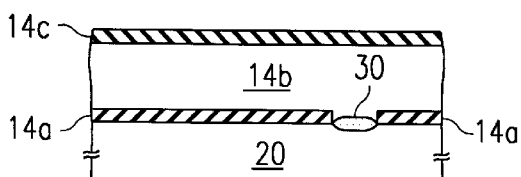

Next, a second oxide layer 14c is grown and/or deposited. As shown in FIG. 4C, oxide layer 14c is formed on silicon layer 14b. However, oxide layer 14c may alternatively or additionally be formed on a second silicon wafer 22 prior to the bonding step described below. A typical thickness is on the order of 10 nm, although it is not necessary that the first (14a) and second (14c) oxides have the same thickness.

Figure 4D:
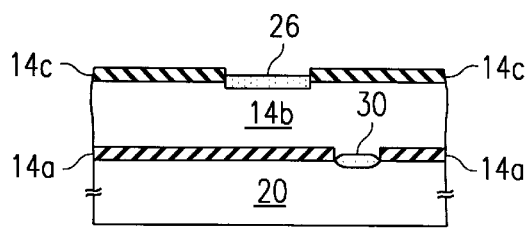
Figure 4E:
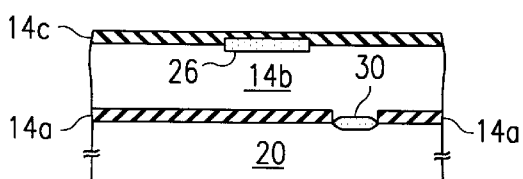

If a patterned silicide is also desired, oxide layer 14c may be patterned and etched to expose portions of silicon layer 14b where silicide is desired. Then, a silicide 26 is formed on the exposed silicon, as shown in FIG. 4D. Typically, a metal such a titanium is deposited followed by a sinter to react the metal with the silicon to form the silicide 26. The unreacted metal is then removed. Referring to FIG. 4E, additional oxide is deposited to extend layer 14c over the silicide 26. It is most likely then necessary to planarize layer 14c prior to bonding, for example using CMP (chemical-mechanical polishing).

Figure 4F:
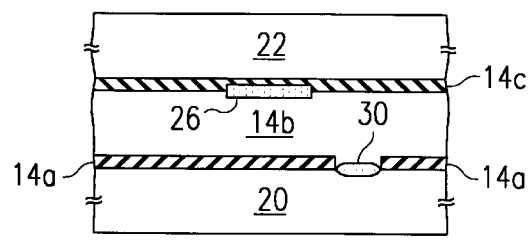

Referring to FIG. 4F, the second wafer 22 is bonded to the oxide layer 14c. Then, either the first wafer 20 or the second wafer 22 is thinned to form a device layer 16 of FIG. 1. The other of the two wafers becomes the substrate layer 12 of FIG. 1. Thus, the above described process may be used to provide a connection between the silicon layer 14b and either the device layer 16 or the substrate 12.

As in the other embodiments, various dielectrics may be used in place of the oxide for layers 14a and 14c described above. For example, a nitrided oxide may be used. If a deposited oxide, such as TEOS, is used, it is preferred to include a densification of the deposited oxide prior to bonding.

Figure 5A:
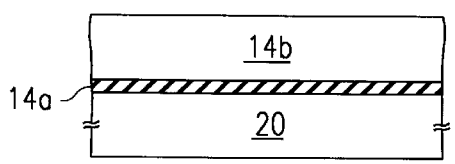
FIGS. 5A–5E are cross-sectional diagrams of the SOI structure of FIG. 1 including a contact between the silicon device layer and the substrate at various stages of fabrication.

A fourth exemplary method of forming the SOI structure 10 including a contact between the substrate layer 12 and device layer 16 will now be discussed with reference to FIGS. 5A–5E. On a staring silicon wafer 20, an oxide layer 14a is grown and/or deposited as shown in FIG. 5A. Typical thickness is on the order of 10 nm, but different thicknesses can be used. Next, a silicon (either poly or amorphous) layer 14b is deposited on layer 14a. Typical thickness may be in the range of 1–10 μm.

Figure 5B:
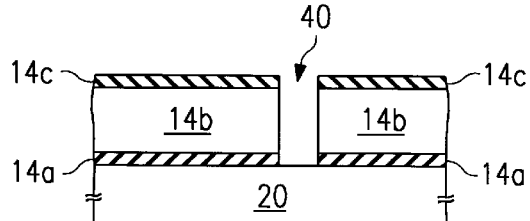

Next, a second oxide layer 14c is grown and/or deposited. As shown in FIG. 5B, oxide layer 14c is formed on silicon layer 14b. A typical thickness is on the order of 10 nm, although it is not necessary that the first (14a) and second (14c) oxides have the same thickness. The structure is then patterned and a contact hole 40 is etched through layers 14a–c to expose a portion of the starting wafer 20.

Figure 5C:
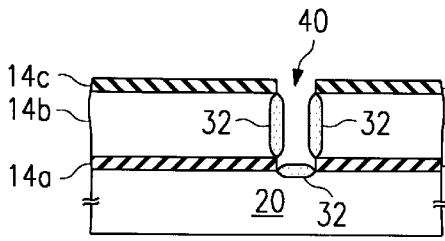
Figure 5D:
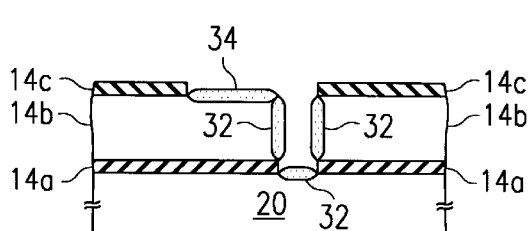
Figure 5E:
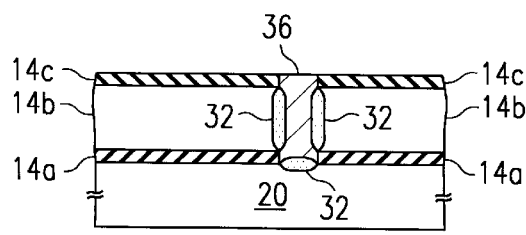

Referring to FIG. 5C, a silicide 32 may then be formed on the exposed silicon surfaces. This includes the exposed portion of starting wafer 20 and the sidewalls of silicon layer 14b. Conventional method for forming silicide may be used. If desired, additional portions of layer 14c may also be removed as shown in FIG. 5D to provide a silicide portion 34 on a horizontal surface of layer 14b. This provides that the contact to the subsequently bonded second wafer 22 will include a silicide contact. Then, a conductive material 36 is used to fill the contact, as shown in FIG. 5E. The second wafer 22 is then bonded to the oxide layer 14c. Either the first wafer 20 or the second wafer 22 is then thinned to form a device layer 16 of FIG. 1. The other of the two wafers becomes the substrate layer 12 of FIG. 1.

Figure 6A:
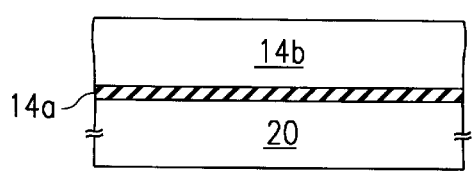
FIGS. 6A–6D are cross-sectional diagrams of the SOI structure of FIG. 1 including an implanted region at various stages of fabrication.
Figure 6B:
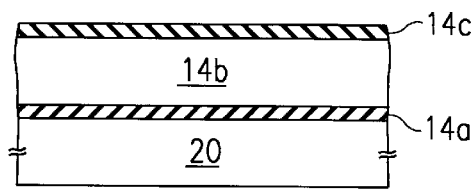

A fifth exemplary method of forming the SOI structure 10 including an implant in the buried multi-layer 14 will now be discussed with reference to FIGS. 6A–6F. The process begins the same as the first embodiment. On a staring silicon wafer 20, an oxide layer 14a is grown and/or deposited as shown in FIG. 6A. Next, a silicon (either poly or amorphous) layer 14b is deposited on layer 14a. Then, a second oxide layer 14c is grown and/or deposited on silicon layer 14b, as shown in FIG. 6B.

Figure 6C:
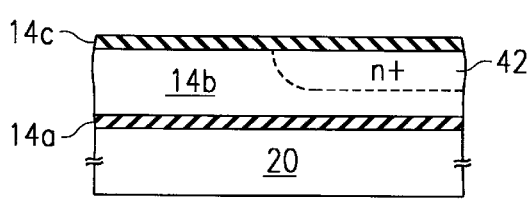
Figure 6D:
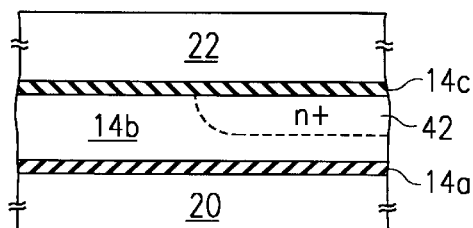
Figure 7A:
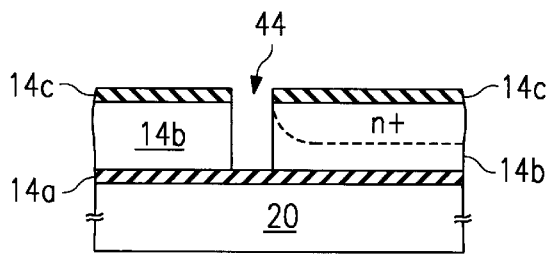
FIGS. 7A–7B are cross-sectional diagrams of the SOI structure of PIG. 1 including an implanted region and trench isolation at various stages of fabrication.
Figure 7B:
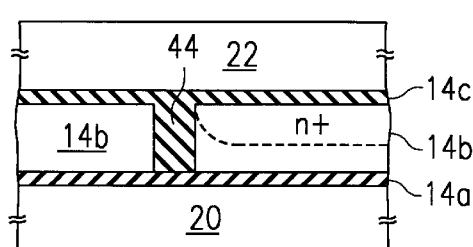

At this point, a patterned implant may be performed to implant dopant through the oxide layer 14c into layer 14b, as shown in FIG. 6C. This forms a doped region 42 in deposited silicon layer 14b. Referring to FIG. 6D, the second wafer 22 is bonded to the oxide layer 14c and then either the first wafer 20 or the second wafer 22 is then thinned to form a device layer 16 of FIG. 1. The other of the two wafers becomes the substrate layer 12 of FIG. 1. Optionally, the implant into layer 14b may be postponed until after bonding and thinning to avoid redistribution of the impurities during bond anneal To provide better isolation between the implant region of layer 14b and the non-implanted region, a trench 44 may be etched through layers 14a and 14b prior to bonding, as shown in FIG. 7A. The trench 44 is then filled with dielectric material as is known in the art and the structure is planarized as shown in FIG. 7B. Processing would then continue with bonding and thinning.

Figure 8A:
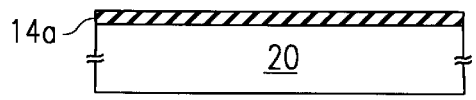
FIGS. 8A–8C are cross-sectional diagrams of the SOI structure of FIG. 1 including alternating oxide and nitride layers at various stages of fabrication.
Figure 8B:
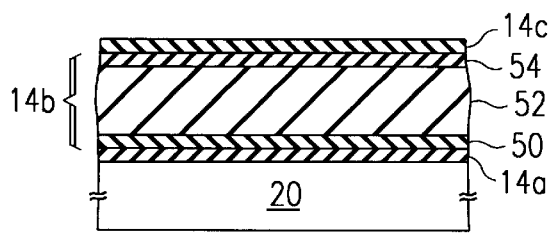
Figure 8C:
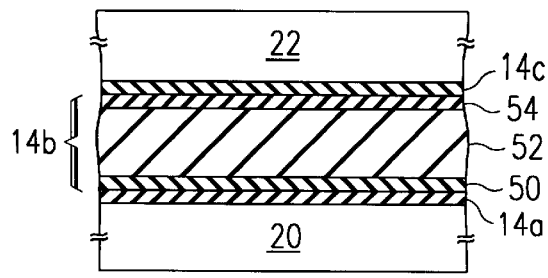

A sixth exemplary method of forming the SOI structure 10 will now be discussed with reference to FIGS. 8A–8C. On a starting silicon wafer 20, an oxide layer 14a is grown and/or deposited as shown in FIG. 8A. Typical thickness is on the order of 10 nm, but different thicknesses can be used. Next, layer 14b is formed on layer 14a. In this embodiment, layer 14b consist of alternating layers of nitride and oxide. Three alternating layers (50, 52, and 54) are shown in FIG. 8B. To form layer 14b, silicon nitride 50 may be deposited on oxide layer 14a. Then, silicon dioxide 52 is formed on silicon nitride 50. Finally, silicon nitride 54 is deposited on silicon dioxide 52. The thicknesses of the layers 50, 52, and 54 is chosen such that the average thermal expansion of buried multi-layer 14 approaches the thermal expansion of silicon. It is preferable that no single layer is thicker than 2 μm. Optionally, layers of other materials, such as nitrided oxide or deposited silicon, could be used as long as the thicknesses are chosen so that the total thermal expansion approximates the thermal expansion of silicon.

Next, a second oxide layer 14c is grown and/or deposited on layer 14b. Referring to FIG. 8C, the second wafer 22 is bonded to the oxide layer 14c and then either the first wafer 20 or the second wafer 22 is then thinned to form a device layer 16 of FIG. 1. The other of the two wafers becomes the substrate layer 12 of FIG. 1.

It should be noted that various dielectrics may be used in place of the oxide for layers 14a and 14c described above. For example, a nitrided oxide may be used. If a deposited oxide, such as TEOS, is used, it is preferred to include a densification of the deposited oxide prior to bonding.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description For example, the use of different materials in the buried insulating layer to obtain reduced warping or stress for an equivalent electrical thickness of SiO2 can be combined with other SOI structures or processes, including SOI with interconnect or back gate incorporated in the insulating layer. It is therefore intended that the appended claims encompass any such modifications or embodiments.

I claim:

1. A silicon-on-insulator structure, comprising:
   a substrate;

a device layer comprising silicon; and a buried insulating layer between the substrate and device layer, said buried insulating layer comprising a first dielectric layer adjacent said substrate, a layer of silicon adjacent said first dielectric layer, and a second dielectric layer adjacent said device layer, wherein said layer of silicon comprises an implanted region.

2. The structure of claim 1, wherein said layer of silicon comprises an isolation trench laterally adjacent said implanted region.

3. The structure of claim 1, wherein a portion of said silicon layer extends through said first dielectric layer to connect to said substrate.

4. The structure of claim 1, wherein a portion of said silicon layer extends through said first dielectric layer to connect to said device layer.

5. The structure of claim 1, further comprising a silicide layer on a portion of said silicon layer.

6. The structure of claim 1, further comprising a contact extending from said device layer through said insulating layer to said substrate.

7. The structure of claim 6, further comprising silicide in said contact adjacent said substrate and sidewalls of said silicon layer.

8. The structure of claim 1, wherein said layer of silicon comprises polysilicon.

9. The structure of claim 1, wherein said layer of silicon comprises amorphous silicon.

10. The structure of claim 1, wherein said insulating layer is greater than 2 $\mu$m thick.

11. A silicon-on-insulator structure, comprising:

a substrate;

a device layer;

an electrically insulating layer between said substrate and said device layer, said electrically insulating layer comprising:

a first layer of oxide adjacent said substrate:

a layer of silicon adjacent said first oxide layer:

a second layer of oxide located on an opposite side of said silicon layer from said first layer of oxide between said layer of silicon and said device layer.

12. The structure of claim 11, wherein said silicon layer comprises:

a layer of polysilicon.

13. The structure of claim 11, wherein said layer of polysilicon is thicker than said first and second layers of oxide.

14. The structure of claim 11, wherein said silicon layer comprises:

a layer of amorphous silicon.

15. A silicon-on-insulator structure, comprising:

a substrate;

a device layer comprising silicon;

a buried insulating layer between the substrate and device layer, said buried insulating layer comprising a first dielectric layer adjacent said substrate, a layer of silicon adjacent said first dielectric layer, and a second dielectric layer adjacent said device layer; and a contact extending from said device layer through said insulating layer to said substrate, said contact having silicide in said contact adjacent said substrate and sidewalls of said silicon layer.

* * * * *